US006642601B2

(12) United States Patent
Marshall et al.

(10) Patent No.: US 6,642,601 B2
(45) Date of Patent: Nov. 4, 2003

(54) LOW CURRENT SUBSTANTIALLY SILICIDE FUSE FOR INTEGRATED CIRCUITS

(75) Inventors: Andrew Marshall, Dallas, TX (US); Douglas A. Prinslow, McKinney, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 10/001,591

(22) Filed: Oct. 25, 2001

(65) Prior Publication Data

US 2002/0074618 A1 Jun. 20, 2002

Related U.S. Application Data

(60) Provisional application No. 60/256,498, filed on Dec. 18, 2000.

(51) Int. Cl.[7] ........ H01L 29/00

(52) U.S. Cl. ........ 257/529; 257/625; 257/755; 257/773

(58) Field of Search ........ 257/529, 625, 257/773, 755, 757

(56) References Cited

U.S. PATENT DOCUMENTS 5,708,291 A * 1/1998 Bohr et al. ........ 257/529
5,969,404 A * 10/1999 Bohr et al. ........ 257/529
6,163,062 A * 12/2000 Shiratake et al. ........ 257/209
6,258,700 B1 * 7/2001 Bohr et al. ........ 438/131
6,323,534 B1 * 11/2001 Marr et al. ........ 257/209
6,337,507 B1 * 1/2002 Bohr et al. ........ 257/529
6,368,902 B1 * 4/2002 Kothandaraman et al. .. 257/529
6,410,367 B2 * 6/2002 Marr et al. ........ 438/132
6,420,217 B1 * 7/2002 Kalnitsky et al. ........ 438/132
2001/0002322 A1 * 5/2001 Marr et al. ........ 438/132
2001/0046726 A1 * 11/2001 Wang et al. ........ 438/135
2002/0005396 A1 * 1/2002 Baird et al. ........ 219/121.68
2002/0005564 A1 * 1/2002 Marr et al. ........ 257/529
2002/0014680 A1 * 2/2002 Tottori ........ 257/529
2002/0086462 A1 * 7/2002 Kothandaraman et al. .. 438/132
2002/0086516 A1 * 7/2002 Hsu et al. ........ 438/617
2002/0102755 A1 * 8/2002 Marr et al. ........ 438/22

* cited by examiner

*Primary Examiner*—Nathan J. Flynn
*Assistant Examiner*—Pershelle Greene
(74) *Attorney, Agent, or Firm*—Rose Alyssa Keagy; W. James Brady, III; Frederick J. Telecky, Jr.

(57) ABSTRACT

A fuse (50, 150, 200) with a low fusing current includes a first contact element (51, 151, 201) and a second contact element (51, 151, 201). A fusing element (53, 153, 203) is coupled between the first and second contact elements (51, 151, 201). At least a majority of the fusing element (53, 153, 203) comprises silicided material.

22 Claims, 4 Drawing Sheets

52
54
52
58
58
51
51
53
50
56
56
64
62
56
56
62
60
50
64

LOW CURRENT SUBSTANTIALLY SILICIDE FUSE FOR INTEGRATED CIRCUITS

This application claims priority under 35 USC §119(e)(1) of provisional application numbers 60/256,498 filed Dec. 18, 2000.

TECHNICAL FIELD OF THE INVENTION

This invention relates generally to the field of electronic devices, and more particularly to a fuse with a low fusing current and methods for making and using the same.

BACKGROUND OF THE INVENTION

Modern electronic equipment such as televisions, telephones, radios, computers and personal communication systems are generally constructed of solid state devices. Solid state devices are preferred in electronic equipment because they are extremely small and relatively inexpensive. In addition, solid state devices are very reliable because they have no moving parts, but are based on the movement of charge carriers.

Solid state devices may be transistors, capacitors, resistors, fuses and other semi-conductor devices. Typically, such devices are fabricated on a substrate and interconnected to form an integrated circuit. Integrated circuits use fuses for die identification, analog trim functions and to selectively bypass non-functional circuitry such as in a faulty dynamic random access memory (DRAM).

One type of fuse used in integrated circuits is the polysilicon fuse. Polysilicon fuses are cost efficient and reliable but require a large potential of about five volts to be successfully blown. The large potential is problematic for low voltage processes and equipment and/or equipment that use electrical means to blow fuses through a serial interface.

To accommodate lower voltage and other requirements, polysilicon fuses have been silicided. The thin silicide layer provides a low resistance path across the fuse that allows the fuse to be blown by a potential of about three volts. Silicided fuses, however, require that a high amount of power be rapidly introduced into the fuse to blow both the silicide layer and the polysilicon layer at the same time. The high amount of power requires large fusing resistors which take up valuable area on an integrated circuit chip and can cause damage to the chip during fusing.

SUMMARY OF THE INVENTION

The present invention provides a fuse and a method that substantially reduce or eliminate problems and disadvantages associated with previous systems and methods. In particular, the fuse comprises minimal or no resistive polysilicon in the fusing element to reduce the necessary fusing current and to allow use of polysilicon fuses in low voltage integrated circuits.

In accordance with one embodiment of the present invention, a fuse for an integrated or other suitable circuit includes a first contact element and a second contact element. A fusing element is coupled between the first and second contact elements. At least a majority of the fusing element comprises silicided material.

More specifically, in accordance with a particular embodiment of the present invention, a polysilicon layer extends across at least part of the first and second contact elements. In this embodiment, the polysilicon layer may taper down to a minimal thickness for the fusing element or taper off in the contact elements in which case the fusing element is comprised solely of a silicide layer. The first and second contact elements may each include a transition area in which the width of the fuse thins after tapering of the polysilicon layer to provide a reliable and well-defined fusing element.

Technical advantages of the present invention include providing an improved fuse and method for an integrated or other suitable circuit. In a particular embodiment, the fuse fuses at a low voltage and/or power to extend down the range of voltages in which polysilicon fuses can be used. In addition, standard components may be used for the fusing detector and smaller fusing transistors used in connection with the fuse. Thus, the size of the fuse cell is reduced.

Another technical advantage of one or more embodiments of the present invention includes providing a fuse having a substantially silicided fusing area. In particular, resistive polysilicon is minimized or eliminated from the fusing area to lower the fusing current and reduce damage to the integrated circuit during fusing. In addition, the possibility of partial fusing is reduced.

Other technical advantages of the present invention will be readily apparent to one skilled in the art from the following figures, description, and claims.

BRIEF DESCRIPTION OF THE DRAWINGS

For a more complete understanding of the present invention and its advantages, reference is now made to the following description taken in conjunction with the accompanied drawings, in which.

DETAILED DESCRIPTION OF THE INVENTION

Figure 1:
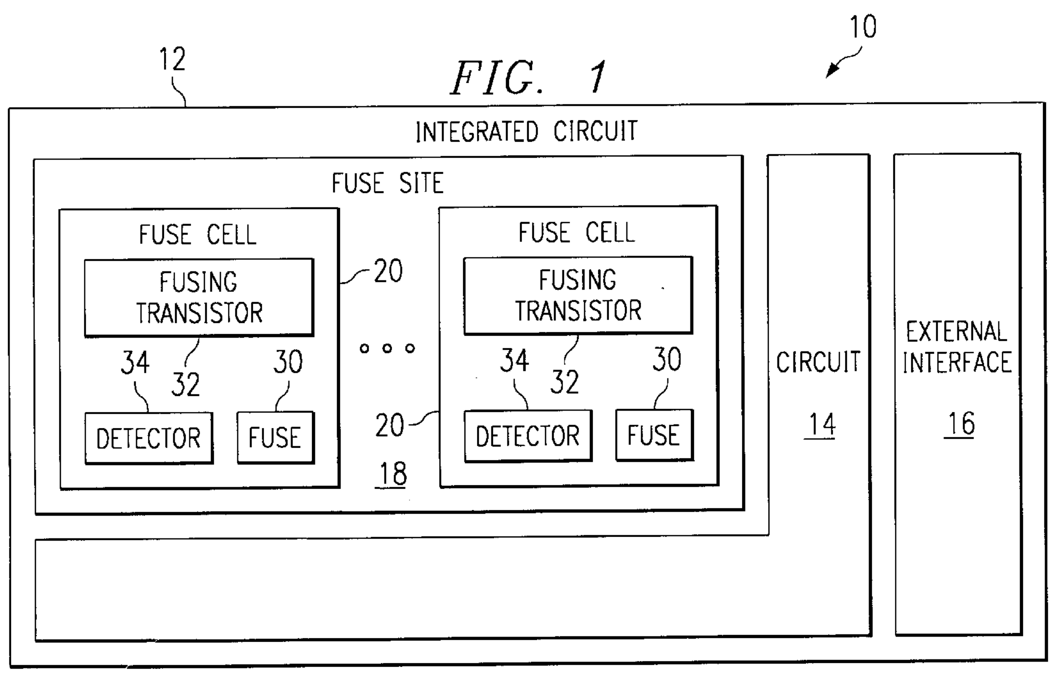
FIG. 1 is a block diagram illustrating an integrated circuit (IC) including fuses in accordance with one embodiment of the present invention.

FIG. 1 illustrates an integrated circuit chip 10 in accordance with one embodiment of the present invention. The integrated chip 10 may be a general purpose processor, application specific integrated circuit (ASIC), field programmable gate array (FPGA) or other suitable digital signal processor (DSP) as well as a memory, analog, mixed signal or other suitable electronic device.

Referring to FIG. 1, the integrated chip 10 includes a substrate 12. A circuit 14, external interface 16 and fuse site 18 are formed in and on the substrate 12. In one embodiment, the circuit 12 is a low voltage circuit operating at 2.0 volts or below. In a particular embodiment, the circuit 12 operates at 1.8 volt, 1.0 volt or below.

The circuit 12 may be a digital and/or analog circuit. The circuit 12 includes transistors, capacitors, resistors and other suitable electrically or electromagnetically coupled components. In a particular embodiment, the circuit 14 is a memory circuit comprising wordlines, bitlines, and storage cells as well as read and/or write logic.

The external interface 16 includes bond pads, signal line and bus connections, power couplings and other suitable connectors for coupling the integrated circuit chip 10 to external devices and systems. In a particular embodiment, the external interface 16 is or includes a serial interface allowing electrical access to the fuse site 18 to read and/or blow fuses.

The fuse site 18 includes one or more fuse cells 20 for die identification, analog trim functions and repair functions such as selectively bypassing non-functional circuitry in circuit 14. In a particular embodiment in which the circuit 14 is a Dynamic Random Access Memory (DRAM), the fuse cells 20 comprise repair fuses operable to be programmed with a redundant address that is transmitted on a bus to a memory core that uses the redundant address to substitute redundant lines of memory cells for primary lines of memory cells that are defective.

The fuse cells 20 each include a low voltage or other suitable fuse element 30, a fusing transistor 32, and a fusing detector 34. As used herein, the term each means everyone of at least a subset of the identified items. The fuse 30 is a polysilicon or other suitable solid state fuse configured to blow at a low fusing voltage compatible with the circuit 14. As a result, damage to the integrated circuit chip 10 and the circuit 14 during fusing is minimized.

The fusing transistor 32 generates and controls fusing current to the fuse 30. Preferably, the fusing voltage is 0.5 to 1.5 volts higher than the operating voltage of the circuit 14 to prevent the fuse 30 from being blown during normal operation of the circuit 14 while at the same time allowing the fuse 30 to be blown without damaging the circuit 14 and by electrical means through the external interface 16 or other suitable serial interface. For a 1.8 volt circuit, for example, the fuse 30 may have a fusing voltage of 2.5 volts. In this embodiment, the fusing transistor 32 comprises a size of approximately 4×7 microns in the fuse cell 20.

The fusing detector 34 detects the blown or unblown state of the fuse 30. For the 1.8 volt circuit, the fusing detector 34 indicates an unblown fuse at a potential of less than about 100 millivolt across the fuse 30 and a blown fuse at a potential of greater than about 100 millivolt across the fuse 30. Accordingly, standard components may be used for the fusing detector 34.

Figure 2A:
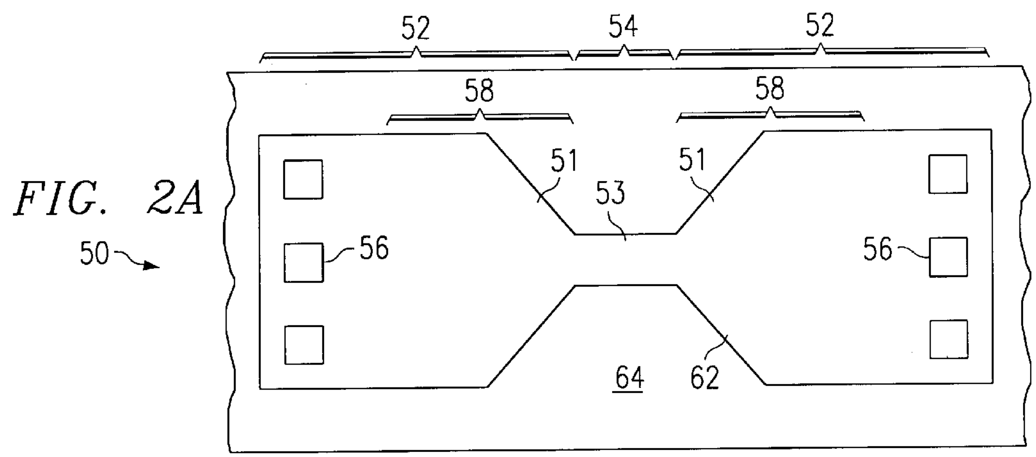
FIGS. 2A–B are top plan and cross-sectional diagrams illustrating details of the fuse of FIG. 1 in accordance with one embodiment of the present invention.
Figure 2B:
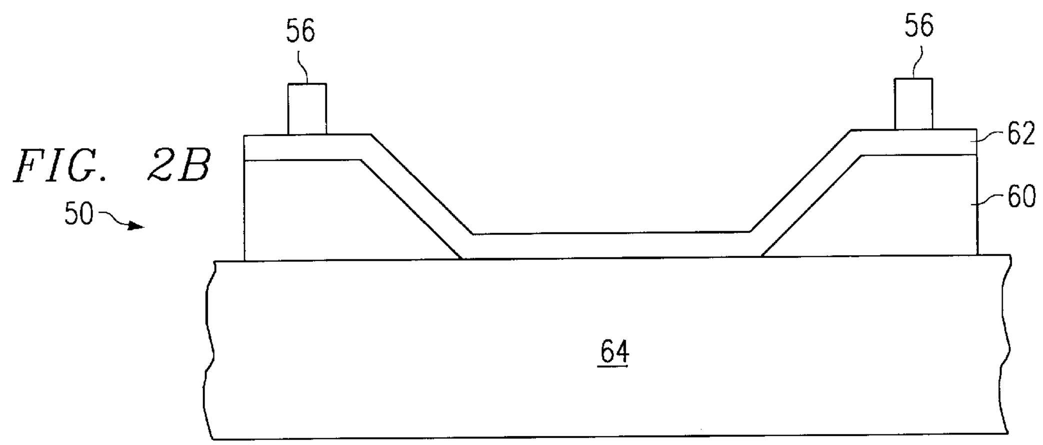

FIGS. 2A–B illustrate details of a fuse 50 in accordance with one embodiment in the present invention. In particular, FIG. 2A is a top plan view of the fuse 50 while FIG. 2B is the corresponding cross-sectional view of the fuse 50. In the illustrated embodiment, the fuse element 50 includes polysilicon bases in the contact areas to provide a stable contact and no polysilicon in the fusing area to minimize fusing current and the possibility of partial fusing. As described in more detail below, polysilicon may be eliminated from the contact areas and/or included in the fusing area without departing from the scope of the present invention.

Referring to FIGS. 2A–B, the fuse 50 includes a plurality of contact elements 51 in contact areas 52 and a fusing element 53 in fusing area 54. The fusing element 51 is disposed between and coupled to the contact elements 51. The contact elements 51 each include contacts 56 for connection to the fusing transistor 32 and fuse detector 34 and a transition area 58 at least between the contacts 56 and the fusing element 53. The transition area 58 comprises all or at least part of the contact elements 51 and transitions dimensions, layers, materials and/or other suitable elements of the fuse 50 between the contacts 56 and the fusing element 53.

The fusing element 53 is the part of the fuse designed to blow upon the introduction of fusing current into the fuse 50. To blow reliably, the fusing element 53 is configured to comprise the highest current per unit area of the fuse 50 during fusing operations. Current density for the fuse 50 may be controlled by the geometry, materials and configuration of the fuse 50.

In the illustrated embodiment, the width and thickness of the fuse 50 thin in the transition areas 58 in the direction of the fusing element 53 to provide the fusing element 53 with the highest current density in the fuse 50. It will be understood that the fuse 50 may be otherwise suitably configured to provide the highest current density in the fusing element 53.

The fuse 50 includes a first conductive layer 60 in the contact elements 51 and a second, more conductive layer 62 disposed outwardly of the first conductive layer 60 in the contact elements 51 and extending across the fusing element 53. The first conductive layer 60 tapers off in the transition area 58 at a gradual slope of less than 90 degrees in the direction of the fusing element 53. Preferably, the slope is less than 60 degrees to limit thickness variations in the second conductive layer 62, which are preferably limited to 50 percent of the thickness to control current density in the transition area 58.

In a particular embodiment, the first connective layer 60 comprises polysilicon and the second, more conductive layer 62 comprises silicided polysilicon. It will be understood that the first and second conductive layers 60 and 62 may comprise other suitable base and silicided material. In the polysilicon embodiment, the polysilicon layer 60 is significantly thicker than the silicide layer 62 in the contact elements 51 to provide a stable base for contacts 56. A layer is significantly thicker than another layer when it is at least twice as thick as the other layer. In the transition area 58, the polysilicon layer 60 tapers off in the direction of the fusing element 53 at or prior to the beginning of the width reduction of the fuse 50 down to the width of the fusing element 53. In the fusing area 54, the silicide layer 62 is disposed directly on the underlying substrate 64 to eliminate relatively resistive polysilicon in the fusing area and reduce the possibility of partial fusing.

In a particular embodiment, the polysilicon layer 60 is 0.25 microns thick under contacts 56 and tapers off at an angle of 45 degrees in the transition area 58. In this embodiment, the silicide layer 62 comprises titanium (Ti) silicide having a thickness of 0.1 microns in the fusing area 54. The fuse 50 comprises a resistance of approximately 5 ohms per square and is configured to blow at a voltage of 2.5 volts and to be used in connection with a 1.8 volt circuit.

FIGS. 3A–E illustrate fabrication of the fuse element 50 in accordance with one embodiment of the present invention. In this embodiment, the fuse element 50 is formed from an integral polysilicon element. The polysilicon anneal for transistors and other components of the integrated circuit chip 10 and/or circuit 14 are performed prior to a polysilicon etch to form the transistor gates and the polysilicon element for the fuse. The polysilicon element is patterned to include the width reduction in the transition area 58.

Figure 3A:
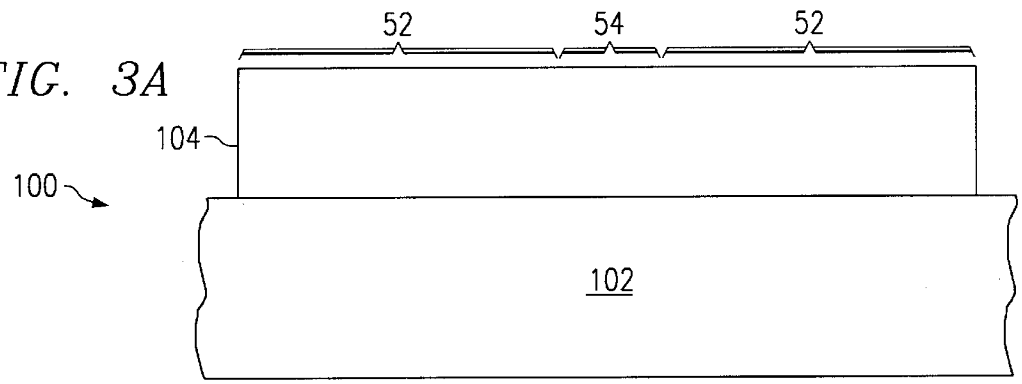
FIGS. 3A–E are a series of cross-sectional diagrams illustrating fabrication of the fuse of FIG. 2 in accordance with one embodiment of the present invention.

Referring to FIG. 3A, an initial semiconductor structure 100 includes an underlying substrate 102 and a polysilicon element 104 formed outwardly of the underlying substrate 102. The underlying substrate 102 may comprise a semiconductor layer, a layer of underlying components, and an epitaxial layer grown on a semiconductor layer and the like. The polysilicon element 104 comprises silicon doped with an n-type or p-type dopant.

Figure 3B:
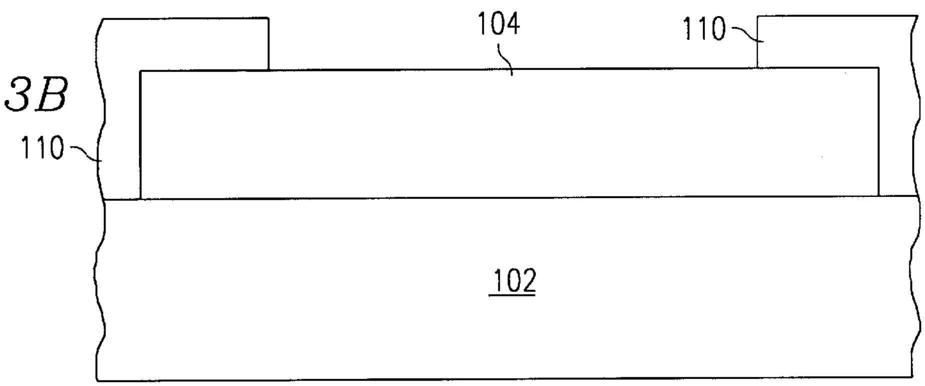

Referring to FIG. 3B, a mask 110 is formed outwardly of the substrate 102 and polysilicon element 104. The mask 110 covers edges of the contact areas 52 while exposing the fuse and transition areas 54 and 58. The mask 110 comprises photoresist or other suitable material.

Figure 3C:
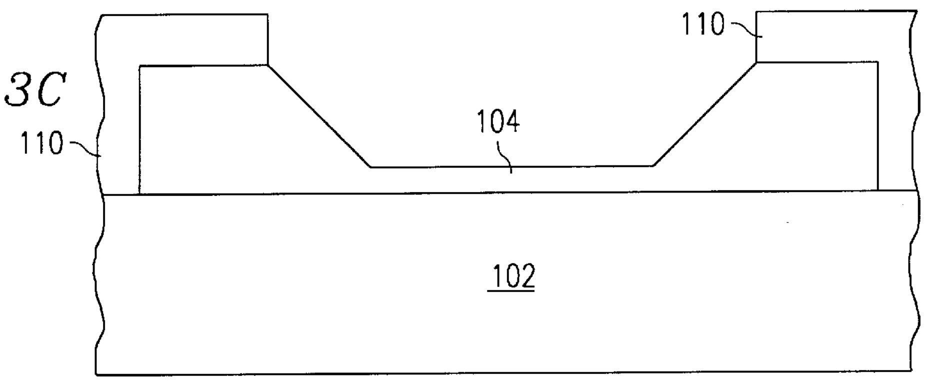

Referring to FIG. 3C, the polysilicon element 104 is isotropically or otherwise suitably etched with a plasma or other suitable etchent to form the gradual slope in the transition area 58 and to reduce the thickness of polysilicon element 104 in the fusing area 54 down to a thickness that is entirely or substantially silicidable. The plasma etch may be followed by deglazing or other suitable cleaning etch.

Figure 3D:
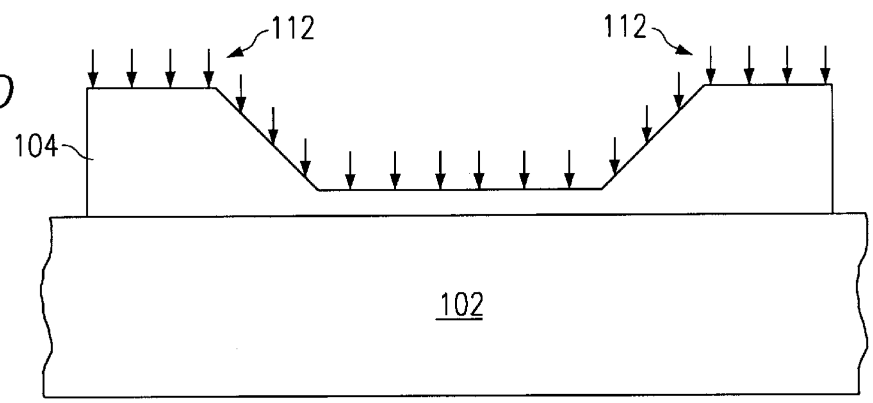

Referring to FIG. 3D, the mask 110 is removed and the remaining polysilicon element 104 doped with titanium (Ti), cobalt (Co), platinum (Pt) or other suitable dopant 112. The dopants 112 are diffused to form the desired polysilicon and silicide layers 60 and 62 upon anneal and/or other processing of the chip.

Figure 3E:
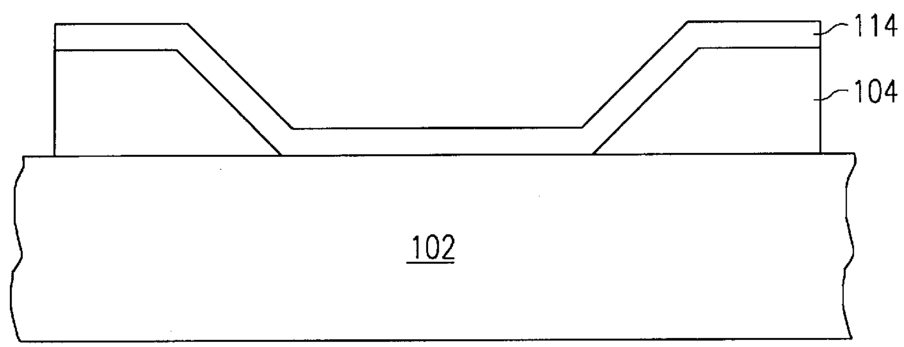

Referring to FIG. 3E, the polysilicon element 104 is annealed to form a silicide layer 114 in an upper portion of the polysilicon element 104 in the contact areas 52 and comprising the entire portion of the polysilicon element 104 in the fusing area 54. A wet etch may be performed after the anneal to remove any oxide formed during the anneal process. In this way, a fuse with a low fusing current is fabricated using conventional processing techniques and in connection with conventional metal oxide semiconductor (MOS) transistors and other integrated circuit devices.

Figure 4A:
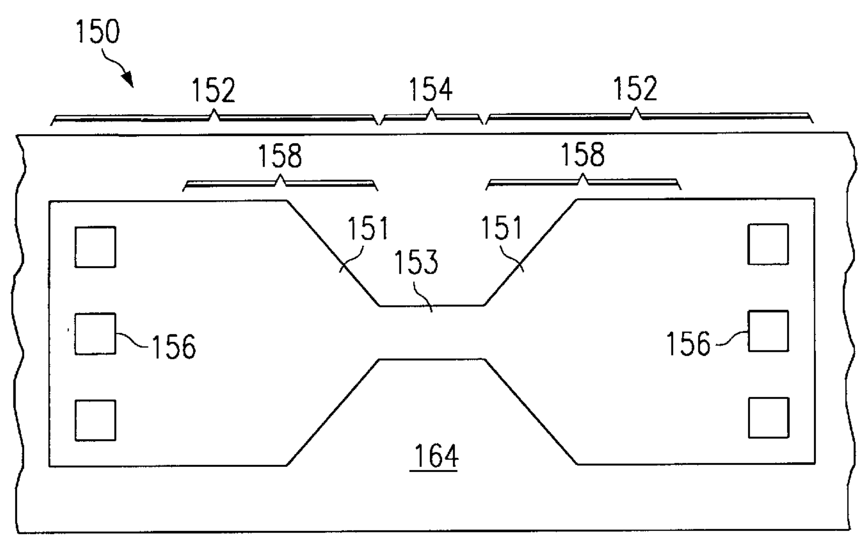
FIGS. 4A–B are top plan and cross-sectional diagrams illustrating details of the fuse of FIG. 1 in accordance with another embodiment of the present invention.
Figure 4B:
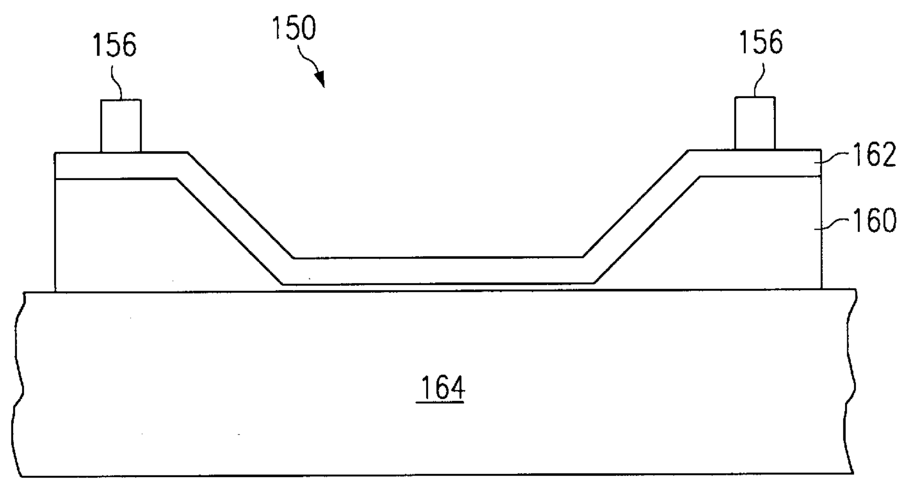

FIGS. 4A–B illustrate details of a fuse 150 in accordance with another embodiment of the present invention. In particular, FIG. 4A is a top plan view of the fuse 150 and FIG. 4B is a corresponding cross-sectional view of the fuse 150. In this embodiment, the fuse 150 includes a limited amount of resistive polysilicon in the fusing area. The fuse 150 is formed as previously described in connection with fuse 50, but with the thickness of the polysilicon element remaining after the isotropic etch and the thickness of the silicide layer formed during the anneal controlled to leave the thin polysilicon layer in the fusing area.

Referring to FIGS. 4A–B, the fuse 150 includes a plurality of contact elements 151 in contact areas 152 and a fusing element 153 in fusing area 154. The contact and fusing areas 152 and 154 correspond to the contact and fusing areas 52 and 54 of fuse 50. The fuse 150 also includes contacts 156 corresponding to the contacts 56 of fuse 50. A transition area 158 extends between the contacts 156 and the fusing area 154. As previously described in connection with fuse 50, fuse 150 comprises polysilicon and silicided polysilicon or other suitable conductive and/or silicided layers.

In the illustrated embodiment, a polysilicon layer 160 and a silicide layer 162 extend across the contact and fusing areas 152 and 154 outwardly of an underlying substrate 164. The polysilicon layer 160 is disposed directly on the underlying substrate 164 and tapers down in the transition area 158 from a first thickness in the contact area 152 to a second thickness in the fusing area 154. The silicide layer 162 is disposed on and outwardly of the polysilicon layer 160 and has a substantially even thickness across the length of the fuse 150. As previously described, the polysilicon layer 160 preferably tapers at a gradual angle to minimize thickness variations in the outwardly formed silicide layer 162.

In the contact area 152, the polysilicon layer 160 is significantly thicker than the silicide layer 162 to provide a stable base for the contacts 156. In the fusing area 154, the polysilicon layer 160 provides a base for the silicide layer 162 to minimize the possibility of the silicide 162 lifting off the underlying substrate 164. The majority of material in the fusing area 154 comprises silicide to allow the fuse to be blown with a low fusing current and reduce the possibility of partial fusing.

In a particular embodiment, the polysilicon layer 160 is 0.25 microns thick under contacts 156 in the contact area 152, 0.12 microns thick in the fusing area 152 and tapers down at an angle of 45 degrees in the transition area 158. The silicide layer 162 is 0.1 microns thick in the contact and fusing areas 152 and 154 and varies less than 20 percent in thickness. In this embodiment, the fuse 150 is operable to be blown at 2.5 volts and used in connection with a 1.8 volt circuit.

Figure 5A:
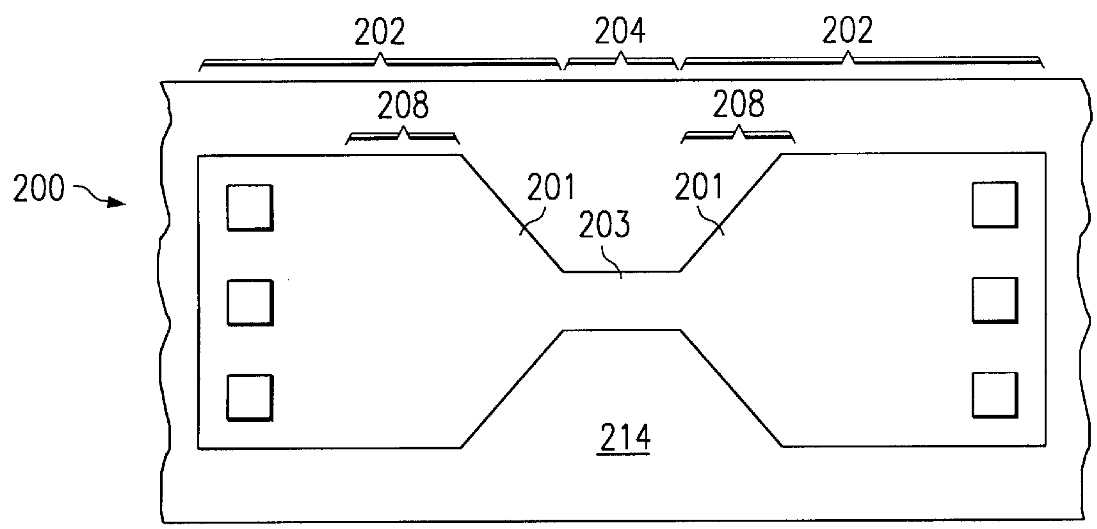
FIGS. 5A–B are top plan and cross-sectional diagrams illustrating details of the fuse of FIG. 1 in accordance with still another embodiment of the present invention.
Figure 5B:
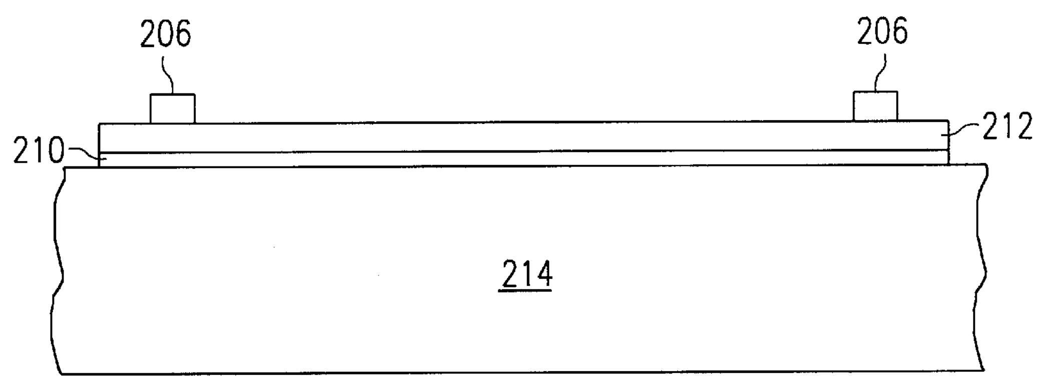

FIGS. 5A–B illustrate details of a fuse element 200 in accordance with still another embodiment of the present invention. In particular, FIG. 5A is a top plan view of the fuse element 200 and FIG. 5B is a corresponding cross-sectional view of the fuse element 200. In this embodiment, the fuse element 200 comprises substantially even thickness and layers across its length and width and comprises a majority of silicide material across its length and width. In this embodiment, the patterning and etching steps to form fuses 50 and 150 with fusing elements of reduced thickness are omitted and dopants evenly applied to an entire polysilicon element to form substantially even polysilicon and silicided layers. As described in connection with fuses 50 and 150, other suitable conductive and/or silicided layers may be used in connection with fuse 200.

Referring to FIGS. 5A–B, the fuse 200 includes a plurality of contact elements 201 in contact areas 202 and a fusing element 203 in fusing area 204. The contact and fusing areas 202 and 204 correspond to the contact and fusing areas 52 and 54 of fuse 50. The fuse 200 also includes contacts 206 corresponding to contacts 56 of fuse 50. A transition area 208 extends between the contacts 206 and the fusing area 204.

In the illustrated embodiment, a polysilicon layer 210 and a silicide layer 212 extend across the contact and fusing areas 202 and 204 outwardly of an underlying substrate 214. Polysilicon layer 210 is disposed directly on the underlying substrate 214 and comprises a substantially equal thickness across the length of the fuse 200. The polysilicon layer 210 provides a base for the silicide layer 212 to minimize the possibility of the silicide 212 lifting off the underlying substrate 214.

The silicide layer 162 is disposed outwardly of the polysilicon layer 160 and also comprises a substantially even thickness across the length of the fuse 200. The majority of the material of the fuse 200 comprises silicided material of the silicide layer 162 across the length and width of the fuse 200 to allow the fuse to be blown with a low fusing current and reduce the possibility of partial fusing.

In a particular embodiment, polysilicon layer 210 is a few tens of nanometers thick and the silicide layer 212 is 0.1 microns thick across the entirety of the fuse 200. In this embodiment, the fuse 200 is operable to be blown at 2.5 volts and used in connection with a 1.8 volt circuit. In this way, a low voltage fuse 200 is formed without additional pattern and etch steps associated with fuses 50 and 150.

Although the present invention has been described with several embodiments, various changes and modifications may be suggested to one skilled in the art. It is intended that the present invention encompass such changes and modifications as fall within the scope of the appended claims.

What is claimed is:

1. A fuse, comprising:

a first contact element;

a second contact element;

a fusing element coupled between the first and second contact elements; and a polysilicon layer extending across at least part of the first and second contact elements, the polysilicon layer in each of the first and second contact elements thinning in height in a direction of the fusing element;

wherein the fusing element comprises substantially no polysilicon.

2. The fuse of claim 1, further comprising:

a silicide layer comprising silicided material extending across the fusing area; and at least a majority of the fusing element comprised of the silicide layer.

3. The fuse of claim 2, further comprising a polysilicon layer extending across the first contact element, second contact element, and fusing element, wherein the silicide layer is substantially thicker than the polysilicon layer in the fusing element.

4. The fuse of claim 3, wherein the polysilicon layer comprises a thickness of less than 0.05 microns in the fusing element.

5. The fuse of claim 3, wherein the polysilicon layer comprises a first thickness in the first contact element, a second thickness in the second contact element and a third thickness in the fusing element, the first and second thickness substantially equal to each other and substantially thicker than the third thickness.

6. The fuse of claim 2, further comprising the silicide layer extending across the first contact element, the second contact element and the fusing element.

7. The fuse of claim 6, wherein the silicide layer comprises a thickness varying less than 20 percent across the first contact element, the second contact element and the fusing element.

8. The fuse of claim 2 wherein the silicide layer extends across the first and second contact elements outwardly of the polysilicon layer.

9. The fuse of claim 8, wherein the polysilicon layer in each of the first and second contact elements thins gradually in height in the direction of the fusing element.

10. The fuse of claim 8, wherein the polysilicon layer in each of the first and second contact elements thins in height substantially at an angle of 60 degrees or less in the direction of the fusing.

11. The fuse of claim 8, wherein the polysilicon layer in each of the first and second elements thins in height substantially at an angle of 45 degrees or less in the direction of the fusing element.

12. The fuse of claim 3, wherein the polysilicon layer is substantially thicker than the silicide layer in at least part of the first and second contact elements.

13. The fuse of claim 1, the fusing element consisting essentially of the silicided material.

14. The fuse of claim 8, further comprising:

the first and second contact elements each comprising a transition area;

the thickness of the polysilicon layer thinning in height in the transition area in the direction of the fusing element; and a width of the fuse thinning in the transition area in the direction of the fusing element.

15. The fuse of claim 14, wherein the width of the fuse and the thickness of the polysilicon layer gradually thin in the direction of the fusing element.

16. The fuse of claim 15, wherein the width of the fuse at least partially thins in the direction of the fusing element after an end of the thinning of the thickness of the polysilicon layer in the direction of the fusing element.

17. An integrated circuit, comprising:

a circuit;

a fuse site including a plurality of polysilicon fuses for use in connection with the circuit; and the polysilicon fuses each comprising:

a polysilicon layer gradually tapering in height in a first contact area and in a second contact area in a direction of a fusing element; and the a fusing element having substantially no polysilicon.

18. The integrated circuit of claim 17, the fusing element consisting essentially of silicided polysilicon.

19. The integrated circuit of claim 17, wherein the fuse is configured to blow at a voltage of 2.5 volts or less.

20. The integrated circuit of claim 17, wherein the circuit is configured to operate at a voltage of 2 volts or less.

21. The integrated circuit of claim 17, wherein the circuit is configured to operate at a voltage of 1.8 volts or less.

22. A fuse for an integrated circuit, comprising:

a polysilicon layer gradually tapering in height in a first contact area and in a second contact area in a direction of a fusing area;

a layer of silicided polysilicon disposed outwardly of the polysilicon layer and extending across the first contact area, the second contact area, and the fusing area;

a width gradually tapering in each of the first and second contact areas between an end of the tapering in height of the polysilicon layer and the fusing area;

the fusing area consisting essentially of silicide polysilicon such that the fuse blows at a voltage of 2.5 volts or less.

* * * * *